(12) United States Patent
Rajeswaran

(10) Patent No.: US 9,601,559 B2
(45) Date of Patent: Mar. 21, 2017

(54) STRUCTURE OF AN ORGANIC DEVICE, METHOD AND APPARATUS FOR PATTERNING THE SAME

(71) Applicant: Gopalan Rajeswaran, Fairport, NY (US)

(72) Inventor: Gopalan Rajeswaran, Fairport, NY (US)

(73) Assignee: GRANTWOOD LIMITED, Fairport, NY (US)

( * ) Notice: Subject to any disclaimer, the term of this patent is extended or adjusted under 35 U.S.C. 154(b) by 0 days.

(21) Appl. No.: 14/806,612

(22) Filed: Jul. 22, 2015

(65) Prior Publication Data

US 2017/0025494 A1 Jan. 26, 2017

(51) Int. Cl.
| | |
|---|---|
| H01L 51/40 | (2006.01) |
| H01L 27/32 | (2006.01) |
| H01L 51/00 | (2006.01) |
| H01L 51/52 | (2006.01) |
| H01L 29/786 | (2006.01) |
| H01L 51/56 | (2006.01) |

(52) U.S. Cl.
CPC ...... *H01L 27/3276* (2013.01); *H01L 27/3211* (2013.01); *H01L 27/3262* (2013.01); *H01L 29/78672* (2013.01); *H01L 29/78696* (2013.01); *H01L 51/0008* (2013.01); *H01L 51/0097* (2013.01); *H01L 51/5206* (2013.01); *H01L 51/5234* (2013.01); *H01L 51/5253* (2013.01); *H01L 51/56* (2013.01); *H01L 2227/323* (2013.01); *H01L 2251/5338* (2013.01); *H01L 2251/566* (2013.01)

(58) Field of Classification Search
None
See application file for complete search history.

(56) References Cited

U.S. PATENT DOCUMENTS 8,241,700 B2 * 8/2012 Ikeda ............... C23C 14/048
427/146

* cited by examiner

*Primary Examiner* — Jack Chen
(74) *Attorney, Agent, or Firm* — Symbus Law Group, LLC; Clifford D. Hyra

(57) ABSTRACT

Embodiments of the present invention provide an AMOLED device having a non-circular base substrate made of crystalline silicon and doped with an impurity, a crystalline silicon layer over the base substrate, multiple pre-defined anode regions having a high pre-defined work-function and made of one or more electrically conductive materials, one or more functional organic layers capable of generating and emitting light and arranged in a predefined pattern of a plurality of emitters. Each emitter has one-to-one mapping to each anode region. The AMOLED device also includes one or more cathode regions adjacent to the one or more functional organic layers. The one or more cathode regions are capable of transmitting the light and have a low pre-defined work-function. The AMOLED device also includes an encapsulation.

8 Claims, 13 Drawing Sheets

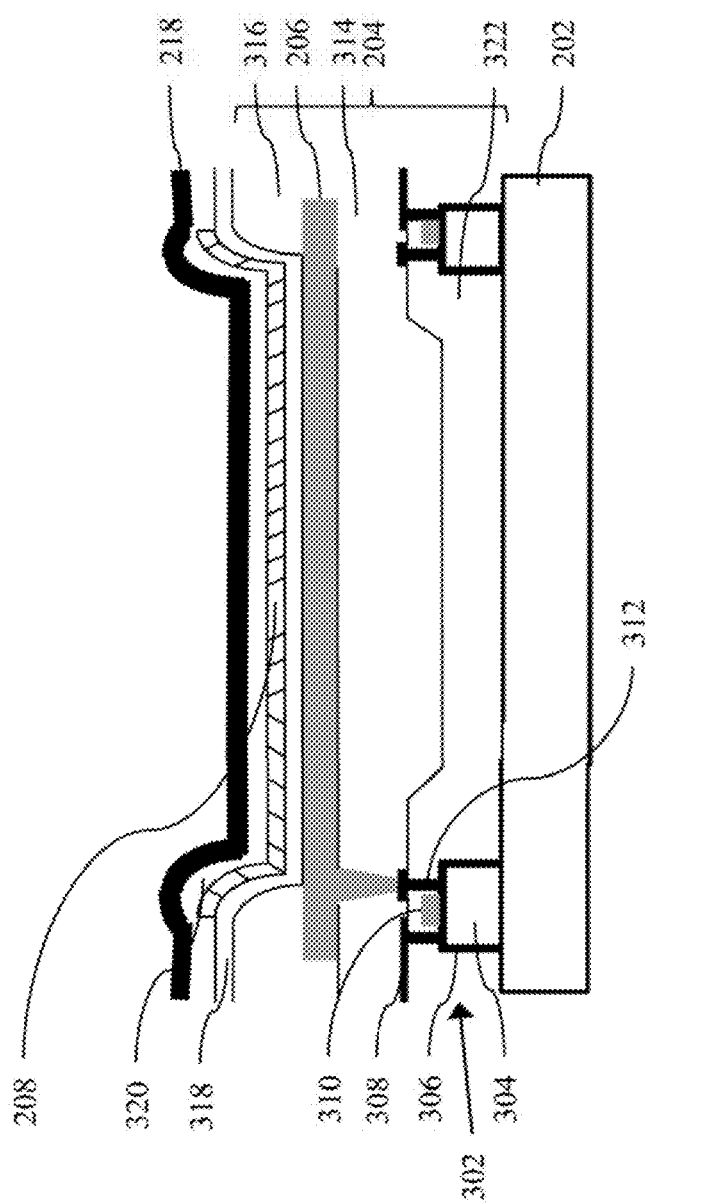

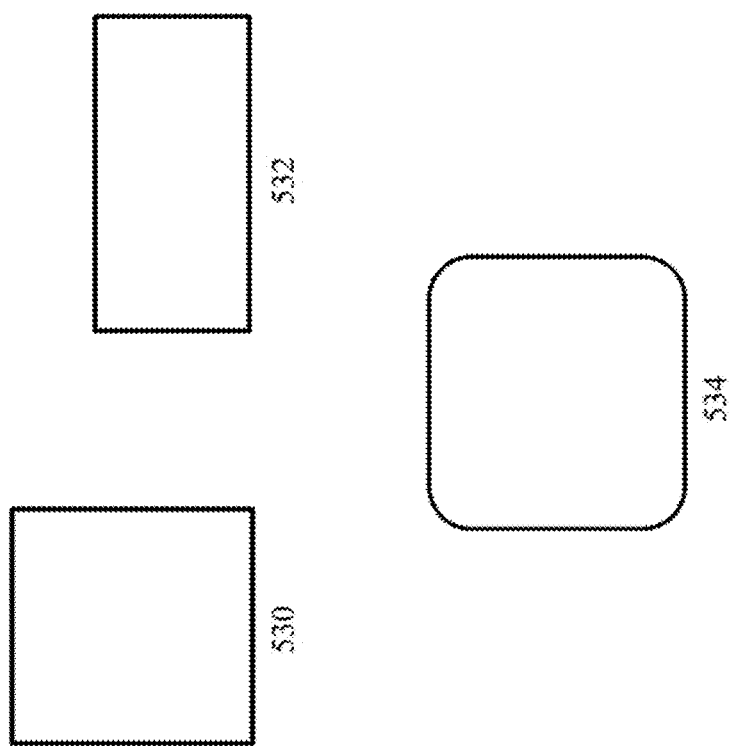

STRUCTURE OF AN ORGANIC DEVICE, METHOD AND APPARATUS FOR PATTERNING THE SAME

BACKGROUND OF THE INVENTION

The present invention relates to a full color organic device and more particularly to a structure of an organic device and a method for patterning the same.

The use of organic light emitting diode (OLED) displays is becoming increasingly common these days. The OLED displays can be used for various applications of various resolutions and sizes, including but not limited to, a mobile phone display, a tablet display, a laptop display and a television display.

The most common embodiment of full color OLED displays has a periodic arrangement of red, green, blue (RGB) or red, green, blue and white (RGBW) color emitting pixels. The number of such color emitting pixels in a display, the size of each of the individual pixels and the spacing between the pixels determine the OLED display characteristics for the intended application. The most common method of preparing commercial OLED displays is by vacuum sublimation of organic molecules from an organic source on to a partially finished display substrate. The organic materials forming the emission layer are formed at each of the target pixel locations on the display substrate, for either of the RGB or RGBW configurations by an appropriate patterning strategy. The emission layer is one of the constituting layers of the OLED device structure of each type of color pixel. There are two vacuum compatible patterning methods commonly employed in commercial OLED display manufacturing. In the case of RGB OLED displays, a physical shadow mask, commonly known as the fine metal mask (FMM), is employed for color pixel patterning. The FMM contains apertures matching the intended color pixel patterns of the OLED displays. The FMM, which is located in the path of the subliming emission layer materials, is at first aligned in close proximity with the display substrate in a vacuum environment before exposure to the path of the subliming organic materials. The FMM apertures are designed to match the pixel patterns covering the entire display substrate area so that all the color pixel layers can be deposited simultaneously. This FMM patterning method is repeated for each of the RGB colors on each of the display substrate to result in the creation of patterns of RGB emission layers on the display substrate. The FMM method, while successful thus far in mobile displays applications, may not be able to meet the increasing demand of higher resolutions in either the smaller mobile displays or the larger television displays, due to complications of mask preparation, mask alignment and accuracy of color reproduction. In the case of RGBW OLED displays, the FMM patterning method is not used. Instead, the color patterning step is performed by using color filter elements which are integrated with the display substrate prior to the formation of OLED devices on said substrate. A vacuum-deposited white OLED device structure with a broad emission spectrum is uniformly formed behind the color filter elements and which are designed to result in the RGB primary colors. As noted above, while the color filter elements for R, G and B pixels are incorporated in the display substrate, the fourth white or W pixel is also added to the display substrate design. The W pixel is unfiltered and can allow the entire white OLED emission spectrum to come through. The RGBW patterning method eliminates the complexities of the FMM patterning process in a vacuum environment and allows for the scaling of full color OLED displays to larger television displays using conventional design rules employed in the display substrate industry.

However, the use of color filter elements in the display substrate increases the number of processing steps required in its manufacturing process and therefore results in increased manufacturing costs. The RGBW patterning method is equally applicable for smaller mobile displays but the requirement of a fourth W pixel will reduce the display resolution, hence an unsatisfactory solution for most of these applications. In summary, both the RGB and RGBW OLED displays and their patterning methods have disadvantages in covering the whole range of display applications from smartphones to televisions and result in additional manufacturing costs due to the use of complex processes and increased number of processing steps.

U.S. Pat. No. 5,851,709 (Grande et al.), U.S. Pat. No. 5,688,551 (Littman et al.), U.S. Pat. No. 6,114,088 (Wolk et al.), U.S. Pat. No. 6,140,009 (Wolk et al.), U.S. Pat. No. 6,214,520 (Wolk e al.), U.S. Pat. No. 6,221,553 (Wolk et al.) teach the use of alternate OLED patterning techniques that do not employ either the FMM or the RGBW patterning methods. These alternate patterning techniques use the method of selective transfer of organic materials, which are uniformly deposited on a source substrate, to the display substrate. The selective transfer is accomplished by incorporating a patterned light-to-heat conversion (LHC) layer on the source substrate under the organic materials and by subsequently heating these LHC layers selectively with a source of intense radiation. This results in the selective transfer of the organic materials, either a single material layer or a multicomponent material layer, from the heated LHC regions. These prior art references cited above suffer from one or more of the following limitations. The method cited in U.S. Pat. No. 5,851,709, for instance, may teach the incorporation of a source substrate with physical apertures that mirror the targeted display substrate color pixel pattern, in combination with the patterned LHC layers, which are also incorporated on the same source substrate. The source substrate cited in this reference can be from the group of silicon, glass or ceramic substrates. Incorporating precise apertures on any of these substrates is an expensive process, involve complex fabrication processes and have size limitations thereby making this patterning method inherently more complex than the FMM method described in an earlier section. Finally, the resulting emission layer of the OLED color pixel on the display substrate is formed directly from the selective transfers from corresponding LHC regions of the source substrate. The method cited in U.S. Pat. No. 5,688,551, for instance, may teach the use of an integrated source substrate containing a donor sheet with pre-patterned LHC layers and uniformly covered with a layer of the organic emission layer materials. The integrated source substrate is aligned, in close proximity, with the display substrate. After alignment, the source substrate is subjected to an intense source of radiation, which results in the selective sublimation of emission layers from the LHC regions of the source substrate to the targeted pixel locations on the display substrate. The introduction of donor sheets for each color inside a vacuum environment adds complexities to the OLED display manufacturing process. Once again, the resulting emission layer of the OLED color pixel on the display substrate is formed directly from corresponding LHC regions of the source substrate. The methods cited in U.S. Pat. Nos. 6,114,088, 6,140,009, 6,214,520, 6,221,553 may teach a variety of options to use an integrated source substrate containing uniform LHC layers inserted between the substrate and a multicomponent organic layer unit. The said multicomponent unit has at least two active OLED device layers. The selective transfer of the entire multicomponent unit is accomplished by exposing the source substrate to an intense radiation according to a pattern, the said exposure pattern corresponding to the color pixel target locations on a display substrate. Once again, the resulting one or more active layers of the OLED device at the color pixel location on the display substrate are formed directly from the selective transfers from corresponding LHC regions of the integrated source substrate. This method additionally introduces more complexity in the manufacturing process since it requires the integration of a radiation source, such as a laser, which can write at the resolution of display pixel sizes. In summary, the search for alternate patterning methods to make RGB or RGBW OLED displays has been extensive over the years and many approaches based on selective transfers from LHC regions have been evaluated but with no clear success. The common theme in all the above methods is the direct transfers of functional organic layers from an LHC region of a source substrate to the corresponding regions on the display substrate. In all cases, the physical patterning process seems to be easy to demonstrate but the optoelectronic properties of the resulting OLED devices resulting from the direct transfer process have been inferior compared to their FMM or RGBW counterparts.

Therefore, there continues to be a need of a simple, cost effective and precise method and apparatus for patterning an organic device. The method and apparatus should allow high-resolution patterning of large and small displays. The method and apparatus should be versatile and capable of patterning displays of various sizes in desired resolutions, with precision. The method and apparatus should provide a high throughput and should be modular in operation.

SUMMARY OF THE INVENTION

In one embodiment, the present invention discloses an active matrix organic light emitting display device. The device includes a base substrate, a crystalline silicon layer, at least one of one or more patterned conductive layers, one or more patterned insulating layers and one or more interconnects, a plurality of predefined anode regions, one or more functional organic layers, one or more cathode regions, and an encapsulation. The base substrate is made of crystalline silicon. The base substrate is doped with an impurity, wherein the impurity is one of a donor impurity and an acceptor impurity. The base substrate is substantially non-circular. The crystalline silicon layer is a non-conducting silicon layer. Each anode region of the plurality of pre-defined anode regions has a high pre-defined work-function, wherein each anode region is made of one or more electrically conductive materials. At least one of the one or more functional organic layers is capable of generating and emitting light, wherein the one or more functional organic layers are arranged in a predefined pattern of a plurality of emitters. Each emitter of the plurality of emitters has one-to-one mapping to each anode region of the plurality of pre-defined anode regions. The one or more cathode regions are adjacent to the one or more functional organic layers, wherein the one or more cathode regions are capable of transmitting the light, wherein the one or more cathode regions has a low pre-defined work-function.

In another embodiment, the present invention discloses a method of manufacturing a plurality of active matrix organic light emitting display devices. The method includes providing a patterned source substrate, providing the patterned source substrate further comprising: providing a source substrate, the source substrate being defined by a first side, the source substrate having a reflector layer on the first side, the reflector layer having a plurality of absorber regions; depositing an organic layer, the organic layer being defined by a first organic layer and a second organic layer, the first organic layer being at the plurality of absorber regions; atleast partially exposing the reflector layer and the absorber region to optical energy, the reflector layer and the absorber region being exposed through the organic layer; and removing the first organic layer only from the plurality of absorber regions; whereby providing the patterned source substrate having an arrangement of the second organic layer and the plurality of absorber regions. The method further comprises providing a base substrate, the base substrate being substantially non-circular, the base substrate having an active matrix organic light emitting display device layout, the patterned source substrate having a mapping to the active matrix organic light emitting display device layout; iteratively sublimating the second organic layer from the patterned source substrate to the base substrate to form at least one of one or more functional organic layers on the base substrate, the base substrate being made of crystalline silicon, the base substrate being doped with an impurity, the impurity being one of a donor impurity and an acceptor impurity; encapsulating at least one of one or more functional organic layers and the one or more electrodes except at one or more predefined separation zones on the base substrate; and separating the plurality of active matrix organic light emitting display devices at the one or more predefined separation zones on the base substrate, whereby forming the plurality of active matrix organic light emitting display devices.

BRIEF DESCRIPTION OF THE DRAWINGS

Some embodiments of the present invention are described with reference to the following drawings for exemplary purposes only. In the drawings, like reference numerals, refer to like parts throughout the various figures unless otherwise specified.

For a better understanding of the presently disclosed subject matter, reference will be made to the following Detailed Description, which is to be read in association with the accompanying drawings, wherein:

FIG. 3B illustrates a composite layer view of the AMOLED device 300, in accordance with an embodiment of the present invention;

FIG. 5B illustrates exemplary shapes of the base substrate 202, in accordance with an embodiment of the present invention;

DESCRIPTION OF THE INVENTION

Figure 1:
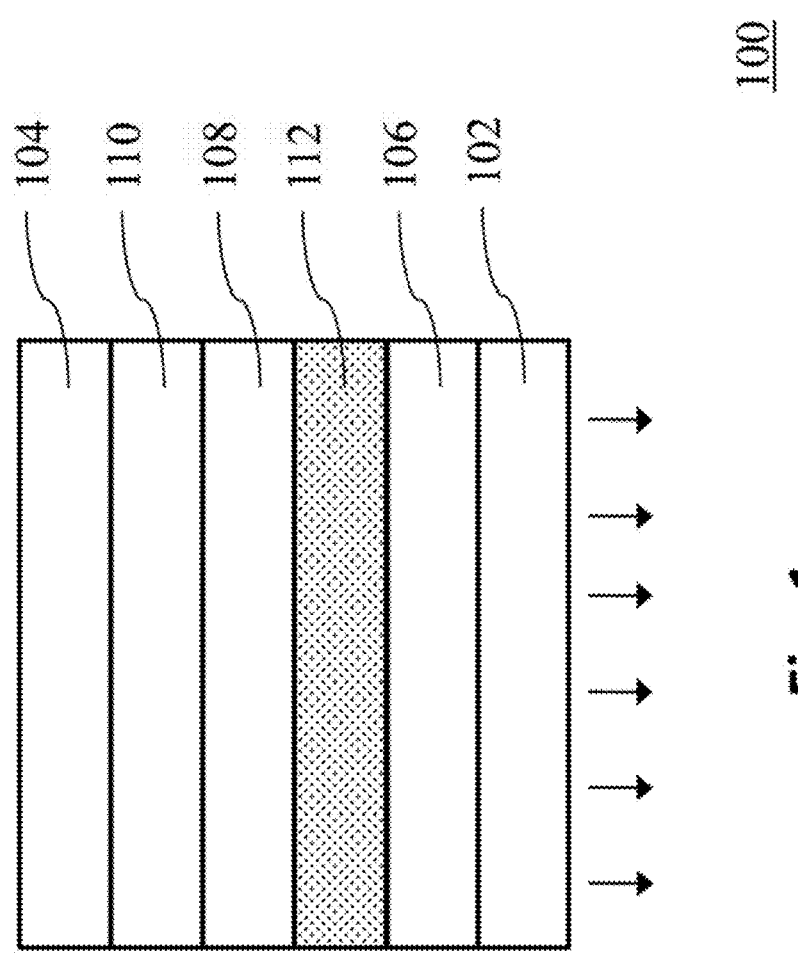
FIG. 1 illustrates an organic light emitting display device, in accordance with an embodiment of the present invention.

The following detailed description is provided with reference to the figures. Exemplary, and in some case preferred, embodiments are described to illustrate the invention, not to limit its scope, which is defined by the claims. Those of ordinary skill in the art will recognize a number of equivalent variations in the description that follows. It should be noted that the drawings are for illustration purpose only and not to the scale.

All technical and scientific terms, unless otherwise defined, used herein have the same meaning as commonly understood by a person ordinarily skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The term "organic device" or "OLED device" refers to a device including organic light emitting diodes, sometimes called an electroluminescent device, or an EL device or an OEL device. The term "display" or "display panel" is employed to designate a screen capable of electronically displaying, images, video, text, etc. The term "pixel" is employed in the art-recognized usage to designate an area of a display panel that can be stimulated to emit light independently of other areas. The term "multicolor" is employed to describe a display panel that is capable of emitting light of a different hue in different areas. The term "full color" is further employed to describe multicolor display panels that are capable of emitting in the red, green, and blue regions of the visible spectrum and displaying images in any combination thereof. The red, green, and blue colors generally constitute the three primary colors from which all other colors can be generated by appropriately mixing these three primaries. The pixel or sub-pixel is generally used to designate the smallest addressable unit in a display panel. For a monochrome display, there is no distinction between a pixel or a sub-pixel. The term "sub-pixel" is used in full color display panels and is employed to designate any portion of a pixel which can be independently addressable to emit a specific color. For example, a blue sub-pixel is that portion of a pixel which can be addressed to emit blue light. In a full-color display, a pixel generally comprises three primary-color sub-pixels, namely blue, green, and red. For the purpose of this invention, the terms "pixel" and "sub-pixel" are used interchangeably. An "organic device" or "OLED" mentioned in the specifications can be used for display applications as well as other applications not specifically mentioned in the description. The present invention is suitable for forming patterned organic layers (emissive or functional) and the use of non-circular non-semiconductor grade silicon base substrate in an AMOLED device. Advantages of the invention are provided below.

FIG. 1 illustrates a typical organic device 100. The organic device 100 can be used in various applications such as a mobile phone display, a tablet display, a display screen of a medical device, a television display, and so forth. Typically, each application requires different characteristics such as shape, size, resolution, flexibility, configuration and so forth. For ease of understanding, the organic device 100 is shown to have a single stack configuration, however, it should be understood that the invention can be practiced for various applications and configurations. The organic device 100, hereinafter, is referred to as the organic device 100. The organic device 100 is shown to include an anode 102 and a cathode 104. The organic device 100 can be a top emitting, a bottom emitting or a dual (multiple) side emitting based on the level of transparency of the anode 102 and the cathode 104. Examples of materials for the anode 102 can include metal oxides such as indium-tin oxide, tin oxide, aluminum or indium-doped zinc oxide, and magnesium-indium oxide, and so on. The cathode 104 may be made of a variety of suitable materials such as magnesium and silver (Mg:Ag) alloy or aluminum in combination with a thin LiF (lithium fluoride) contact layer, and so on.

The organic device 100 is a bottom emitting device having optically opaque cathode and optically transparent anode. Further, various emitter and functional organic layers 106-112 can be sandwiched between the anode 102 and the cathode 104. The organic device 100 can have various functional layers such as a hole transport layer (HTL) 106, a hole blocking layer (HBL) 108, an electron transport layer (ETL) 110, an electron injection layer (EIL) (not shown) and ahole injection layer (HIL) (not shown in the organic device 100). Further, the organic device 100 can have one or more emissive layers (EML) 112. For example, the EML 112 can be a blue EML. These emissive layers are primarily responsible for light generation and electroluminescence.

It is often useful that a hole-injection layer (HIL) (not shown) can be provided in the organic light-emitting display or organic device 100. The material of the HIL can serve to facilitate injection of holes into the HTL 106. Suitable materials for use in the hole-injection layer may include porphyrinic compounds as described in commonly-assigned U.S. Pat. No. 4,720,432 (VanSlykeet al.), and plasma-deposited fluorocarbon polymers as described in commonly-assigned U.S. Pat. No. 6,208,075 (Hung et al.), etc. Alternative materials for HIL are reportedly useful in organic EL or OLED devices as described in EP 0 891 121 A1 (Ghosh et al.) and EP 1,029,909 A1 (Hosokawa et al.).

These functional and emissive layers are typically made of organic compounds. For example, the HTL 106 may include compounds such as an aromatic tertiary amine, where the latter is understood to be a compound containing at least one trivalent nitrogen atom that is bonded only to carbon atoms, at least one of which is a member of an aromatic ring. In one form, the aromatic tertiary amine can be an arylamine, such as a monoarylamine, diarylamine, triarylamine, or a polymeric arylamine. In another example, the HTL 106 may be polycyclic aromatic compounds such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

In another example, the organic device 100 may have a double stack structure (not shown). The double stack organic device, broadly, has a layer structure of two organic devices connected by a connector layer (not shown). It should be understood that the invention is applicable to any type of organic device such as a single stack, double stack or multiple stack configuration. Also, it will be apparent to a person ordinarily skilled in the art that an OLED device (such as the organic device 100) illustrated in FIG. 1 can have more or less number of layers without affecting the scope of the invention. Although, the functional layers are not shown in subsequent figures or described in detail in the corresponding specifications, it will be apparent to a person ordinarily skilled in the art that the functional layers can be considered as a part of the organic device.

Figure 2:
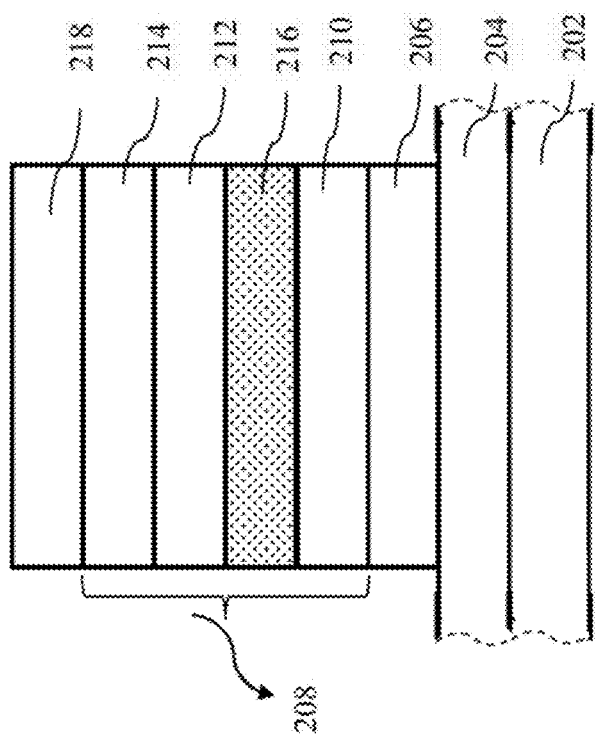
FIG. 2 is a sub-pixel view of an active matrix organic light emitting display (AMOLED) device 200, in accordance with an embodiment of the present invention.

FIG. 2 is a sub-pixel view of an active matrix organic light emitting display (AMOLED) device 200, in accordance with an embodiment of the present invention. A person ordinarily skilled in the art will appreciate that the sub-pixel view of the AMOLED device 200 is shown and described with reference to one sub-pixel for the purpose of understanding. In a typical AMOLED device three (or four) sub-pixels are present in each pixel and multiple such pixels form the AMOLED devices, however, the scope of this invention is not impacted by number of pixels or their arrangement in the AMOLED device 200. The AMOLED device 200 includes a base substrate 202 that is made of crystalline silicon. For example, the base substrate 202 can be made of a monocrystalline silicon or a multi-crystalline silicon. The base substrate 202 is doped with an impurity that can be either a naturally occurring residual impurity or intentionally introduced impurity. For the purpose of this invention, the term "silicon" refers to "solar grade silicon" or "non-semiconductor grade silicon".

In one example, the base substrate 202 may be doped with a donor impurity or an acceptor impurity. The donor impurity may be one or more Group V elements (e.g., phosphorus, arsenic, and so on) of the periodic table. The acceptor impurity may be one or more Group III elements (e.g., boron, aluminum, gallium, and so on) of the periodic table.

The impurity may be present within the base substrate silicon in a predetermined concentration, e.g., up to $1 \times 10^{17}$ per cubic centimeter. In some embodiments, the concentration of the impurity may be varied to adjust the electrical properties of the base substrate 202. For example, the impurity concentration may be varied up to $1 \times 10^{17}$ per cubic centimeter for correspondingly varying resistivity of the base substrate 202 in the range from 10 ohm cm to 1 ohm cm. The base substrate 202 may be made substantially flexible by reducing its thickness. At a particular predefined thickness for example, less than 70 microns, the base substrate 202 becomes substantially flexible. Moreover, the base substrate 202 is substantially non-circular and may be of a square, a rectangular shape and a square shape with rounded corners. The shapes of the base substrate 202 are further explained with reference to FIG. 5B. The base substrate 202 is defined by at least one linear dimension, which is greater than 150 mm. For the purpose of this invention, a linear dimension is defined maximum possible edge-to-edge distance measured along a substantially straight line. In an embodiment, the linear dimension of the base substrate 202 can be between 150 mm and the linear dimension of the ingot from which the base substrate 202 is derived from.

In some embodiments, directional solidification of a molten silicon charge within an inert crucible provides a non-circular silicon ingot that takes the shape of the inert crucible. A crystalline silicon brick is then obtained from the non-circular silicon ingot. The crystalline silicon brick is sliced to form a plurality of base substrates including the base substrate 202.

In some embodiments, a seed silicon crystal is drawn away from the surface of molten silicon charge in an inert crucible providing a circular silicon ingot. A crystalline silicon brick is obtained from the circular silicon ingot has a square cross section with substantially rounded corners. The crystalline silicon brick is sliced to form a plurality of base substrates including the base substrate 202.

A composite layer 204 is disposed over the base substrate 202. The composite layer 204 can be a combination of various components and sub-layers such as a crystalline silicon layer, one or more patterned conductive and insulating layers such as a patterned gate insulator layer, a patterned gate metallization layer, a patterned source layer, a patterned drain layer, a patterned interlevel dielectric layer and one or more patterned planarization layers. It should be understood that the arrangement of the above components and sub-layers is well known in the art and various arrangements are possible. The crystalline silicon layer (which is included in the composite layer 204) is an epitaxial silicon layer, which is a non-conducting (typically un-doped) silicon layer. In some embodiments, the epitaxial silicon layer is an intrinsic epitaxial crystalline silicon layer. The epitaxial silicon layer may be deposited in crystalline form using a variety of methods known in the art, related art or developed later. Such epitaxial silicon layers, when patterned on the surface of the base substrate 202, may assist to form electrical circuits in connection with the AMOLED device 200. A person ordinarily skilled in the art will understand that the AMOLED device 200 can have fewer or more number of components and sub-layers, without affecting the scope of this invention.

The AMOLED device 200 further includes one or more predefined anode regions such as an anode region 206 adjacent to the composite layer 204. It will be understood to a person ordinarily skilled in the art that the anode region 206 may have any predefined shape and may be patterned. In an embodiment, an electrically insulating layer maybe present at the edges of the anode region 206. Furthermore, such an electrically insulating layer may be optionally included in and constitute one of the planarization layers previously referred to in the description of the composite layer 204. The anode region 206 may be made of an electrically conductive material known in the art, related art, or developed later including metals, alloys, and electrically conducting polymers. The anode region 206 has a relatively high predefined work-function approximately more than 4.5 electron volts.

Over the anode region 206, one or more functional organic layers 208 may be disposed. As shown, one or more functional organic layers 208 may include ahole transport layer (HTL) 210, the hole blocking layer (HBL) 212, an electron transport layer (ETL) 214, and the emission layer or an emitter 216 as discussed in the description of FIG. 1. In some embodiments, one or more functional organic layers 208 may also include an electron injection layer (EIL) (not shown) and an hole injection layer (HIL) (not shown). The emitter 216 may define a sub-pixel of a display pixel. The one or more functional organic layers 208 are capable of generating and emitting light and are arranged in a pre-defined pattern. Each emitter of the multiple emitters has one-to-one mapping to each anode region of the multiple pre-defined anode regions. For example, the emitter 216 has one-to-one mapping to the anode region 206.

The one or more functional organic layers 208 may be located adjacent to one or more cathode regions such as a cathode region 218. The cathode region 218 is capable of transmitting light. In one example, the cathode region 218 may be made of semi-transparent or transparent material such as an indium tin oxide layer for transmission of light generated or emitted by the emitter 216. The cathode region 218 may be transparent or may be semi-transparent for display and lighting applications. The cathode region 218 has a low predefined work function relative to a predefined work function of the anode region 206. The cathode region 218 has a low predefined work function of approximately less than 3.6 volts. In some embodiments, multiple organic devices such as the AMOLED device 200 may be stacked together adjacent to each other to form a display device. This is explained further in conjunction with FIG. 3.

Figure 3A:
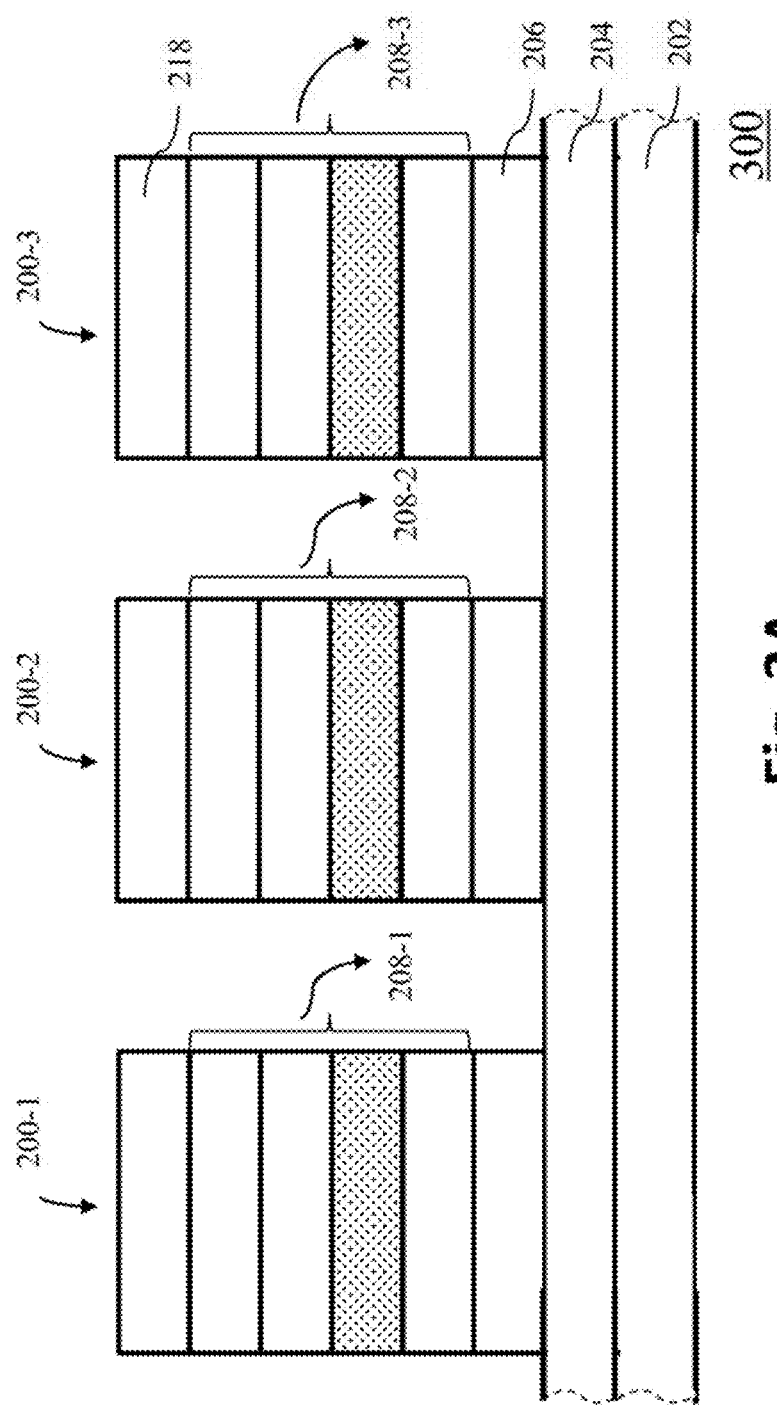
FIG. 3A is a pixel view of an exemplary AMOLED device 300, in accordance with another embodiment of the present invention.

FIG. 3A is a pixel view of an exemplary AMOLED device 300, in accordance with another embodiment of the present invention. An AMOLED device 300 is shown to include three AMOLED devices 200-1, 200-2, 200-3 such that each corresponds to one sub-pixel, however, it will be understood to a person skilled in the art that a typical AMOLED device will include various such devices. The AMOLED device 300 share a common composite layer disposed over a common base substrate. For example, multiple AMOLED devices 200-1, 200-2 and 200-3 have the composite layer 204 disposed over the base substrate 202. Each of the AMOLED devices 202-1, 202-2 and 202-3 may provide a predefined arrangement of red, green, and blue emitters respectively. For example, the AMOLED device 202-1 may corresponds to a red pixel and configured to emit red light, the AMOLED device 202-2 may corresponds to a green pixel and configured to emit green light, and the emitter 202-3 may corresponds to a blue pixel and configured to emit blue light. The red AMOLED device 202-1, the green AMOLED device 202-2, and the blue AMOLED device 202-3 (RGBarrangement) may define a red sub-pixel, a green sub-pixel, a blue sub-pixel respectively. The RGB arrangement is collectively defined as a pixel capable of emitting the primary colors, namely red, green, and blue (RGB). In some embodiments, the AMOLED device 300 is packaged within an encapsulation (not shown). In some embodiments, one or more predefined separation zones are substantially on periphery of the encapsulation. It allows formation of multiple AMOLED devices a single base substrate.

FIG. 3B illustrates a composite layer view of the AMOLED device 300, in accordance with an embodiment of the present invention. The AMOLED device 300 includes the base substrate 202, the composite layer 204, the anode region 206, the one or more functional organic layers 208 and the cathode region 218. The composite layer 204 is shown to include a pixel driver TFT 302 and its constituting layers such as an epitaxial silicon layer, a gate insulator layer, a gate metallization layer, a source metallization layer and a drain metallization layer. The composite layer 204 is disposed over the base substrate 202. In certain cases, the composite layer 204 may include a pixel driver TFT 302 and its constituting layers as described above, an interlayer dielectric layer 322, a first planarization layer 314 and a second planarization layer 316. In summary, the pixel driver TFT 302 further includes an epitaxial silicon 304, a gate insulator 306, a gate 310, a source 308 and a drain 312. The first planarization layer 314 is disposed over the pixel driver TFT 302 and the interlayer dielectric layer 322. The anode region 206 is disposed over the first planarization layer 314 followed again by the second planarization layer 316. The gate, source, drain of the pixel driver TFT are appropriately patterned to provide interconnects to the anode region 206 of the AMOLED device 300 and to other pixel circuit elements such as the switching TFT or a plurality of TFTs, a capacitor or a plurality of capacitors and to the row and column driving circuits located at the peripheral regions of the AMOLED device 300. Thereafter, the one or more functional organic layers 208 is disposed sandwiched between a hole transport layer (HTL) 318 and an electron transport layer (ETL) 320. The cathode region 218 is further disposed at the top to complete the AMOLED device 300. It should be noted that configuration of various layers and components in the AMOLED device 300 could be varied based on requirements. Any such variation including, but not limited to, lesser or more components or layers and a different arrangements have no bearing on the scope of the invention.

Figure 4:
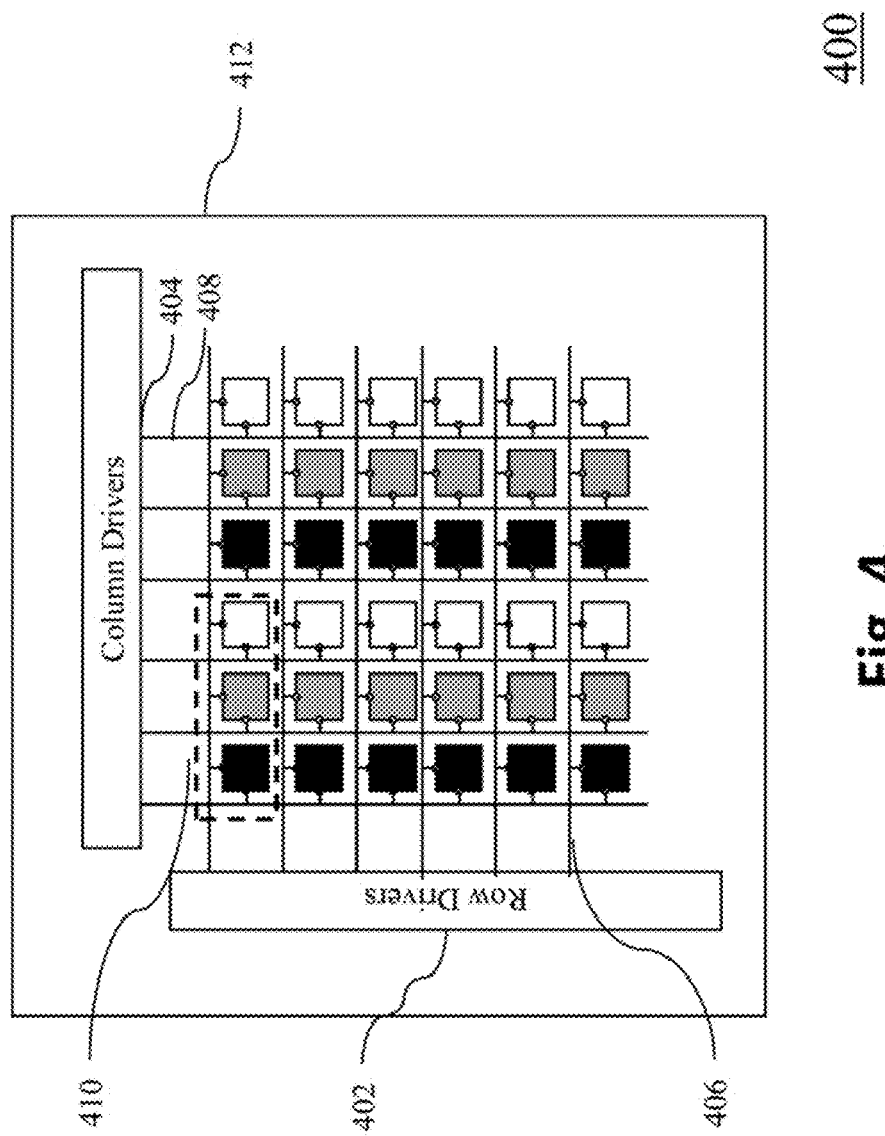
FIG. 4 illustrates an exemplary pixel circuit layout 400 for the AMOLED device 300, in accordance with an embodiment of the present invention.

FIG. 4 illustrates an exemplary pixel circuit layout 400 for the AMOLED device 300, in accordance with an embodiment of the present invention. A pixel circuit layout 400 include a row driving circuit 402 and a column driving circuit 404 connected to the AMOLED device 300 through row interconnect 406 and column interconnect 408 respectively. The interconnects form a grid like structure, electrically coupling driver circuits to pixels. For example, an arrangement 410 shows three pixels (RGB) driven by pixel circuit layout 400. The AMOLED device 300 along with the pixel circuit layout 400 and other components not shown or mentioned is encapsulated in an encapsulation 412.

Figure 5A:
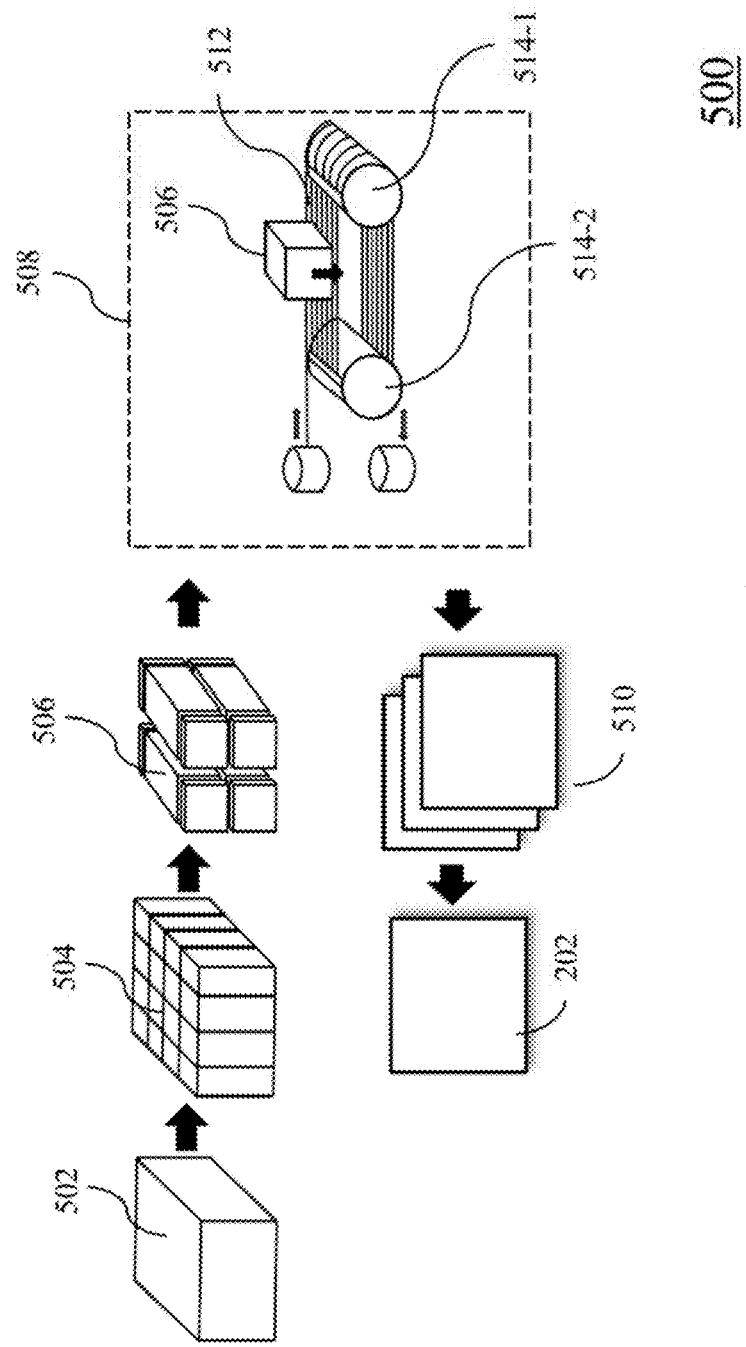
FIG. 5A illustrates an exemplary arrangement 500 for fabricating a base substrate for the AMOLED device 300, in accordance with an embodiment of the present invention.

FIG. 5A illustrates an exemplary arrangement 500 for fabricating the base substrate 202 for the AMOLED device 300, in accordance with an embodiment of the present invention. The base substrate 202 of the AMOLED device 200 may be made of a variety of shapes and sizes based on the application. The shapes of the base substrate 202 are further explained with reference to FIG. 5B. FIG. 5A is further explained in conjunction with FIG. 6.

FIG. 5B illustrates exemplary shapes of the base substrate 202, in accordance with an embodiment of the present invention. The base substrate 202 has a non-circular shape such as a square shape 530, a rectangular shape 532 and a square shape with rounded corners 534. It will be understood to a person ordinarily skilled in the art that any shape other than square, rectangle or a square shape with rounded corners is beyond the scope of this invention. Above shapes allow the use of low purity silicon base substrate in the AMOLED device 300. Typically, such low purity silicon base substrates are used for solar cells, while high purity silicon base substrates are used for AMOLED devices.

Figure 6:
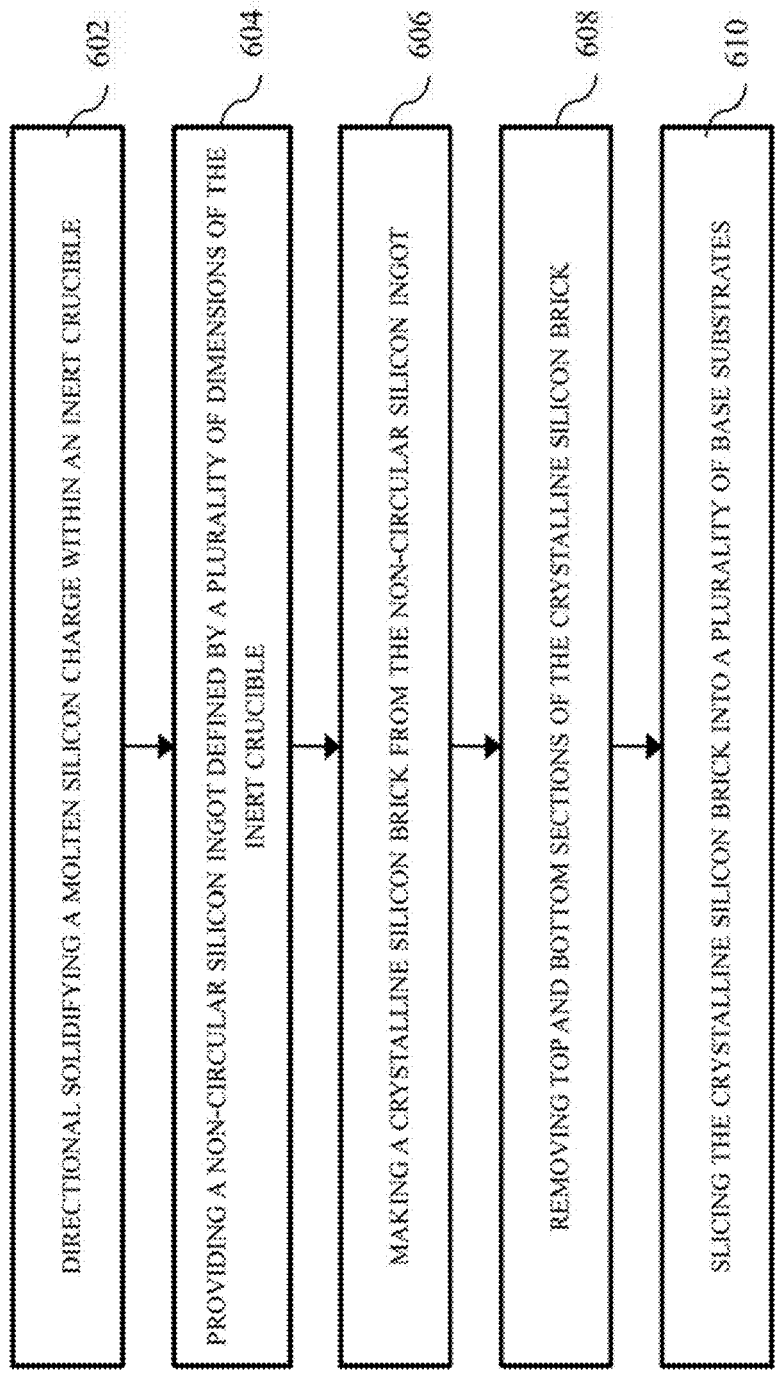
FIG. 6 illustrates a method for fabricating the base substrate 202 for the AMOLED device 300, in accordance with an embodiment of the present invention.

FIG. 6 illustrates a method for fabricating the base substrate 202 for the AMOLED device 300, in accordance with an embodiment of the present invention. At step 602, molten silicon charge may be directionally solidified within an inert crucible (not shown). At step 604, such directional solidification of molten silicon provides a non-circular, such as a square silicon ingot 502 of predetermined dimensions, for e.g., 84 cm×84 cm. It will be understood to a person ordinarily skilled in the art that this invention can be practiced with a square base substrate, a rectangular base substrate or a square base substrate with rounded corners. The obtained dimensions of the square silicon ingot 502 may conform to the dimensions of the inert crucible. At step 606, the square silicon ingot 502 may be cut using a band saw or any other known in the art, related art, or later developed techniques into a plurality of crystalline silicon bricks 504 of fixed or varying dimensions based on the intended application. At step 608, the top and bottom sections of the crystalline silicon brick may be removed to obtain a modified silicon brick 506 without any substantial irregularities at the peripheral surfaces. At step 610, the modified silicon brick 506 with a square cross section, for example, may be then sliced through any of the variety of techniques known in the art, related art, or developed later including a wire saw 508 to make silicon wafers 510 of square cross section. The wire saw 508 may include several round of one or more wires 512 wrapped over supports 514-1, 514-2 (collectively, supports 514). The spacing between parallel rounds of the wires may define the thickness of the obtained silicon wafer 510. The modified silicon brick 506 may be passed through the wire saw 508 to obtain one or more silicon wafers having a predetermined thickness based on the spacing between the wire rounds. Each silicon wafer has a square cross-section and may be lapped and polished for use as the base substrate 202.

Figure 7:
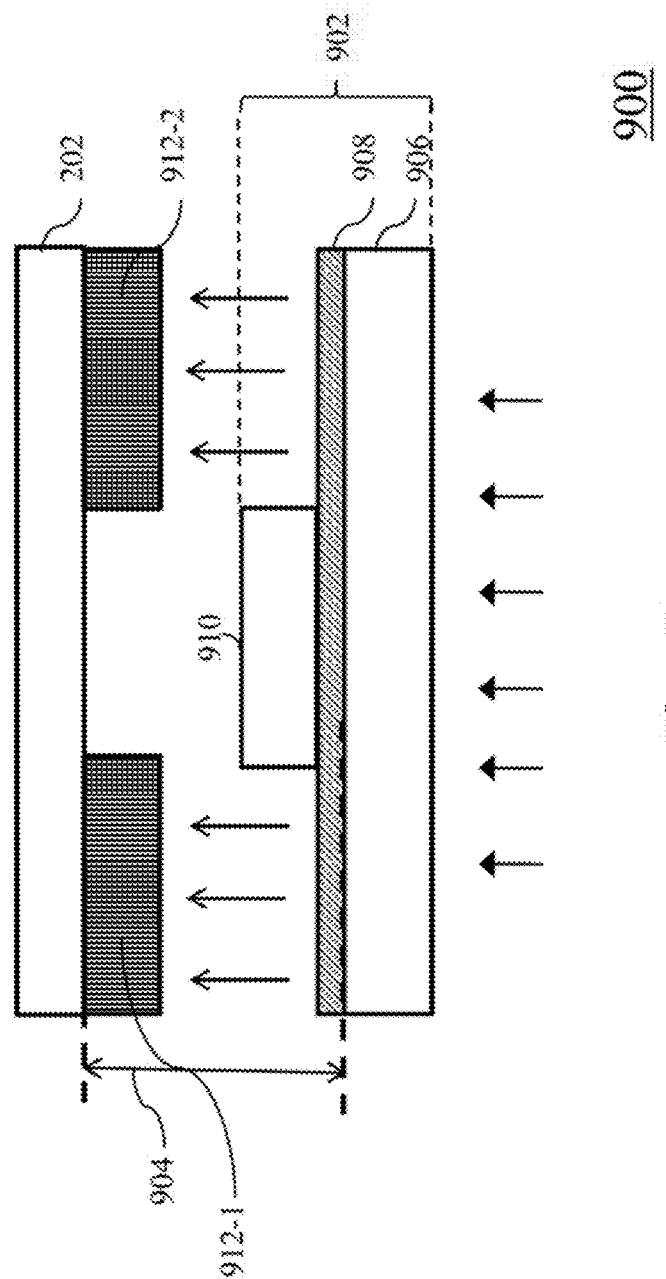
FIG. 7 illustrates an exemplary arrangement 900 for fabricating the AMOLED device 300, in accordance with another embodiment of the present invention.

FIG. 7 illustrates an exemplary arrangement 900 for fabricating the AMOLED device 300, in accordance with another embodiment of the present invention. In one embodiment, the arrangement may include a base substrate such as the base substrate 202 having the composite layer 204, at least one cathode region such as the cathode region 218, one or more dedicated anode regions such as the anode regions 206, as discussed above. The base substrate 202 may have one of a variety of non-circular shapes as described in reference to FIG. 5B. The base substrate 202 may be used as a backplane in combination with a patterned source substrate 902 having a predetermined gap 904 between them to form an organic device.

The patterned source substrate 902 may include one or more predefined optical absorber regions and one or more optical reflector regions. In one example, the patterned source substrate 902 may include a source substrate 906, which may be made of a suitable transparent or an opaque light absorbing material. In one example, the source substrate 906 may be an opaque substrate. In another example, the source substrate 906 may be a transparent substrate. In some embodiments, the source substrate 906 and the base substrate 202 may be defined by a variety of dimensions. For example, the source substrate 906 and the base substrate 202 may have same or different dimensions.

The source substrate 906 may have a reflector layer 908 disposed over it. The source substrate 906 may be made of a suitable material known in the art, related art, or developed later including silicon. One or more absorber regions may be formed on the reflector layer 908. For example, the patterned source substrate 902 may include an absorber region 910 formed over the reflector layer 908. The regions of reflector layer 908 that are not covered by the absorber region 910 are referred to as lateral reflector regions.

In some embodiments, the thickness of the absorber region may be greater than that of the reflector region so as to rest the base substrate 202 over the absorber region 910 to maintain the predetermined gap 904. However, in other embodiments, the gap 904 may be maintained using structural supports (not shown) placed over the absorber region 910. In another embodiment, the gap 904 may be maintained using structural supports (not shown) placed over the surface of the base substrate 202. Further, the width of the absorber region 910 may be according to the intended application. For example, the width of the absorber region 910 may be at least two pixels wide. Over the two lateral reflector regions, organic layers 912-1 and 912-2 (collectively, organic layers 912) may be grown with a predetermined thickness. The organic layers 912 may correspond to a color such as red, green, and blue or any other functional layer of the AMOLED device 300. When the patterned source substrate 902 is heated from the bottom, the heated reflector regions may sublimate the organic layers 912 to deposit the organic layers 912, for example as an emission layer or emitter, on the base substrate 202 placed over the patterned source substrate 902. Such sublimation may be repeated multiple times to form multiple RGB pixels or RGB emitters or any other functional organic layer or layers being formed over respective dedicated anode regions such as the anode regions 304 on the base substrate 202 to forma display. For example, a first patterned source substrate such as the patterned source substrate 902 may be taken with red organic material layer, which may be deposited on the base substrate 202 upon sublimation, followed by a second patterned source substrate with green organic material, and a third patterned source substrate with blue organic material, which may be deposited on the base substrate 202 to form an R emitter, a G emitter, and a B emitter (collectively, RGB emitters 914).

Figure 8:
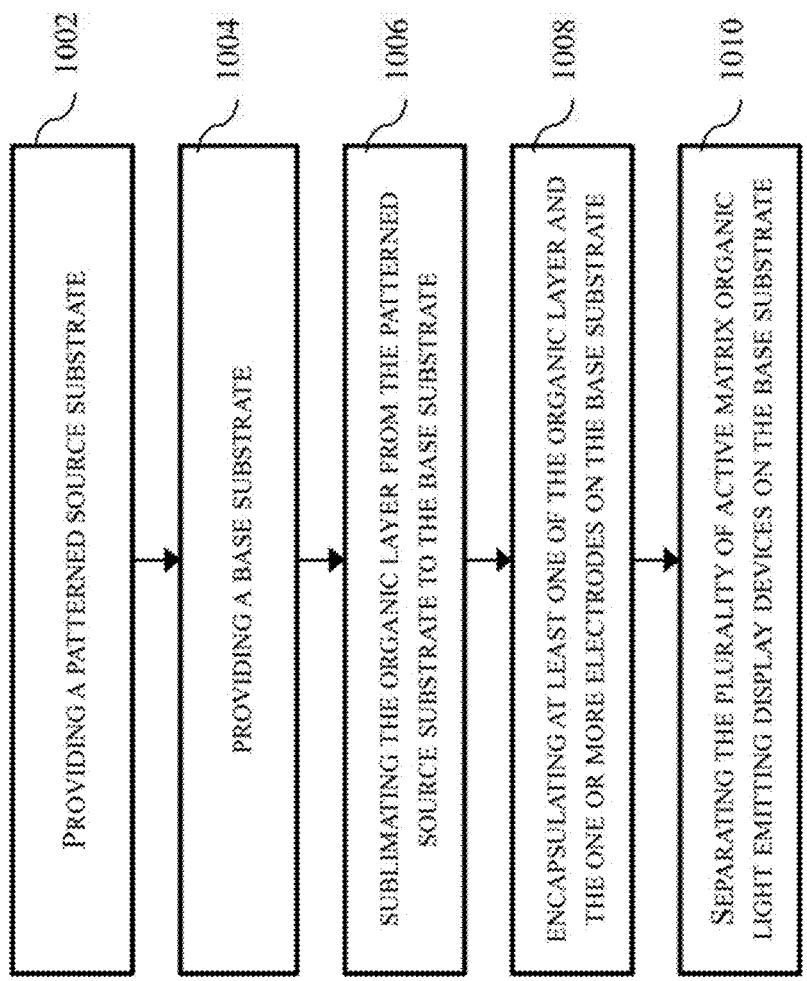
FIG. 8 illustrates an exemplary method for fabricating the AMOLED device 300, according to an embodiment of the present invention.

FIG. 8 illustrates an exemplary method for fabricating the AMOLED device 300, according to an embodiment of the present invention. At step 1002, a patterned source substrate may be provided. The source substrate may include one or more absorber regions and one or more reflector regions disposed over a substrate such as the source substrate 906, which is transparent. Over the reflector regions, an organic layer corresponding to a particular color, such as green, may be disposed.

At step 1004, a base substrate such as the base substrate 202 is provided. The base substrate 202 may be substantially non-circular as described in reference to FIG. 5B. Moreover, the base substrate 202 has a linear dimension greater than 150 mm. In some embodiments, a plurality of anodes may be deposited over the base substrate 202. In some embodiments, the base substrate 202 may be put through one or more lapping process and polishing process. The base substrate 202 may include an active matrix organic light emitting display device layout, which may include one or more functional organic layers, each layer being disposed between a dedicated anode region and one or more cathode regions. In other words, each set of the functional organic layers may have one-to-one mapping with one anode region. The functional organic layer may include various layers such as electron transport layer, hole blocking layer, hole transport layer etc. as discussed in the description of FIG. 2 except the emission layer or the emitter. The patterned source substrate may be mapped to the layout of the base substrate 202 with the reflector region of the source substrate being aligned to the anode region on the base substrate 202. A variety of techniques known in the art, related art, or developed later including an infrared alignment method may be used for such alignment. In an embodiment, an intrinsic epitaxial silicon layer is provided on the base substrate 202, which has a square shape, a rectangular shape or a square shape with rounder corners. Further, a plurality of pixel circuits and one or more row and column driving circuits are fabricated. The plurality of pixel circuits and the one or more row and column driving circuits can include one or more patterned conductive layers, one or more patterned insulating layers, the crystalline silicon layer and one or more interconnects. In other words, circuit processing is done on a square shaped base substrate, a rectangular shaped base substrate or a square shaped base substrate with rounder corners.

At step 1006, the organic layer such as the organic layers 912 from the patterned source substrate 902 may be iteratively sublimed to the base substrate 202 to form one or more functional organic layers on the base substrate 202. The patterned source substrate 902 can heated from the bottom using a variety of techniques such as rapid thermal processing techniques. The sublimed organic layer such as the organic layers 912 from the reflector regions, such as the lateral reflector regions as discussed above, may deposit on an anode region such as the anode region 206 on the base substrate 202. Different color organic layers such as red, green, and blue, from over the lateral reflector regions may be iteratively sublimed to each of the predefined anode regions such as the anode regions 206 to form an emission layer or emitters on the base substrate 202. For example, such sublimation of organic layers may be iterated with multiple patterned source substrates each having a different colored organic layer such as red, green, and blue to deposit a red emission layer (corresponding to R sub-pixel), a green emission layer (corresponding to G sub-pixel), and a blue emission layer (corresponding to B sub-pixel) on respective dedicated anode regions on the base substrate 202 to form RGB sub-pixels, which define a display pixel. In one example, the base substrate 202 may be made of crystalline silicon and doped with a donor impurity or an acceptor impurity. In some embodiments, the donor impurity is one or more of Group V elements and the acceptor impurity is one or more of Group III elements of the periodic table. In some embodiments, impurity has a concentration up to $1 \times 10^{17}$ per cubic centimeter. In some embodiments, the base substrate 202 may have a predetermined resistivity, e.g., ranging from 1 to 10 ohm cm. It will be understood to a person ordinarily skilled in the art that the step 1006 of iterative sublimation can be used repeatedly or once to deposit multiple functional or non-functions layers without affecting the scope of the invention.

At step 1008, one or more functional organic layers, such as those deposited on the base substrate 202 from the patterned source substrate 902, and the one or more electrodes in communication with the base substrate 202 may be packaged in a predefined encapsulation such as the encapsulation 412 except at one or more predefined separation zones. In one example, such one or more predefined separation zones may occur between each of the plurality of active matrix organic light emitting display devices on the base substrate 202.

At step 1010, active matrix organic light emitting display (AMOLED) devices such as the AMOLED device 200 is separated at the one or more predefined separation zones on the base substrate 202 to form one or more AMOLED devices.

Figure 9:
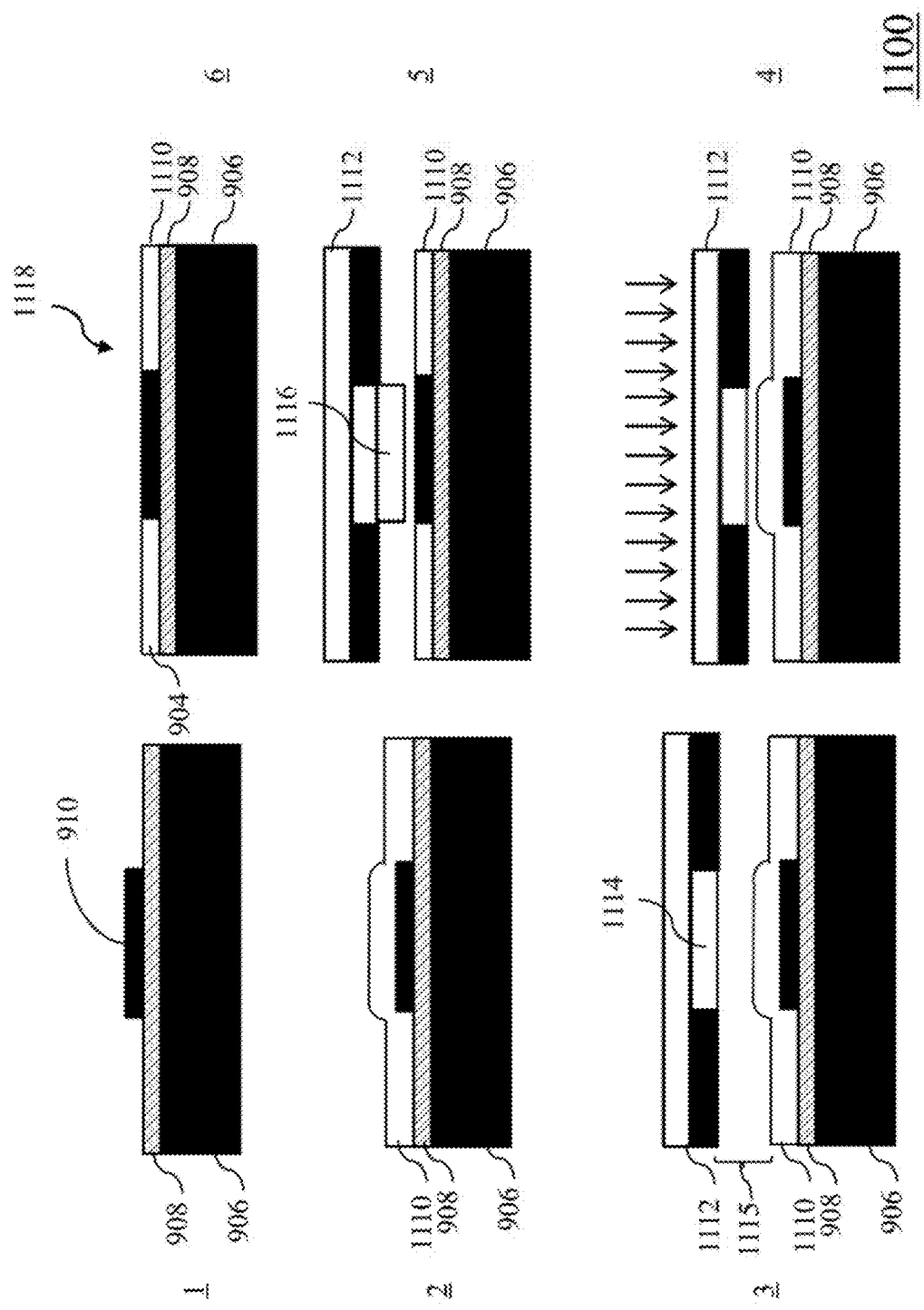
FIG. 9 illustrates an exemplary arrangement 1100 for fabricating the patterned source substrate 902 for manufacturing the AMOLED device 300, according to an embodiment of the present invention.

FIG. 9 illustrates an exemplary arrangement 1100 for fabricating the patterned source substrate 902 for manufacturing the AMOLED device 300, according to an embodiment of the present invention. The arrangement 1100 may involve six stations for fabricating the patterned source substrate. At station 1, an opaque substrate such as the source substrate 906 is provided. The source substrate 906 is an opaque source substrate for the purpose of this embodiment. The source substrate 906 may be made of a suitable material known in the art, related art, or developed later including silicon. A reflector layer such as the reflector layer 908 may be disposed over the source substrate 906. An absorber region 910 may be grown over the reflector layer 908. The absorber region 910 may generate more heat relative to reflector layer 908 due to the relatively different light absorption characteristics. In other words, the absorber region 910 when subjected to intense optical radiations generate more heat compared to the reflector layer 908.

At station 2, an organic layer 1110 corresponding to a color such as red, green, and blue may be deposited over the absorber region 910 and portions of the reflector layer 908. Such deposition may be performed in a controlled environment such as vacuum by a variety of techniques known in the art, related art, or developed later such as vacuum deposition.

At station 3, an exposure substrate 1112 may be placed above the source substrate 906 having the deposited organic layer 1110. The exposure substrate 1112 may include one or more openings such an opening 1114. The exposure substrate 1112 may be appropriately aligned over the source substrate 906 using infrared light such that the opening 1114 is located directly above the absorber region 910 of the source substrate 906. A predefined spacing 1115 may be maintained between the exposure substrate 1112 and the organic layer-covered source substrate 906.

At station 4, light may be passed through the exposure substrate 1112 on to the organic layer-covered source substrate 906. The light may pass through the opening 1114 in the exposure substrate 1112 on to the organic layer 1110. The absorber region 910 may absorb the light and heat up faster than the reflector layer 908.

At station 5, the organic layer 1110 over the absorber region 910 may be removed by sublimation due to the heat supplied by the heated absorber region 910. Such removed organic material 1116 may be recovered from the exposure substrate 1112, recycled and reused.

At station 6, once the heated organic layer 1116 over the absorber region 910 is removed, a patterned source substrate 1118 is obtained. The patterned source substrate such as the patterned source substrate 902 may include the source substrate 906 having organic layers deposited adjacent to the absorber region 910 over the reflector layer 908.

Figure 10:
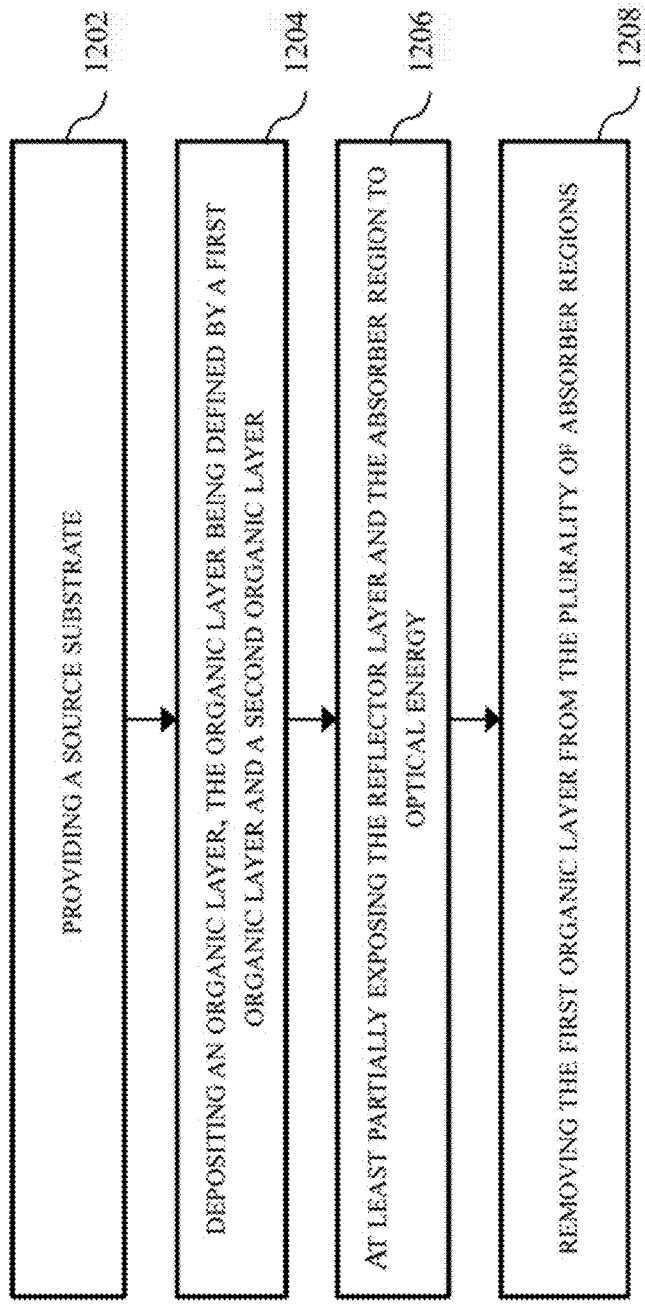
FIG. 10 illustrates an exemplary method of fabricating the patterned source substrate 902 for manufacturing the AMOLED device 300, according to a an embodiment of the present invention.

FIG. 10 illustrates an exemplary method of fabricating the patterned source substrate 902 for manufacturing the AMOLED device 300, according to an embodiment of the present invention. At step 1202, a source substrate may be provided. The source substrate may be made of a transparent or opaque light absorbing material. The source substrate may be defined by a first side having a reflector layer. The reflector layer may include one or more absorber regions.

At step 1204, an organic layer is deposited on the source substrate. A first portion of the organic layer (hereinafter referred to as a first organic layer) may be deposited on the absorber regions, and a second portion of the organic layer (hereinafter referred to as second organic layer) may be deposited on the portions of reflector layer not covered by the absorber regions. At step 1206, at least partially exposing the reflector layer and the absorber region to optical energy. In one example, the absorber region may be exposed to the optical energy through the first organic layer. At step 1208, the first organic layer from the absorber regions is removed to provide a patterned source substrate such the patterned source substrate 902 or 1118 having an arrangement of the second organic layer and the absorber regions.

Figure 11:
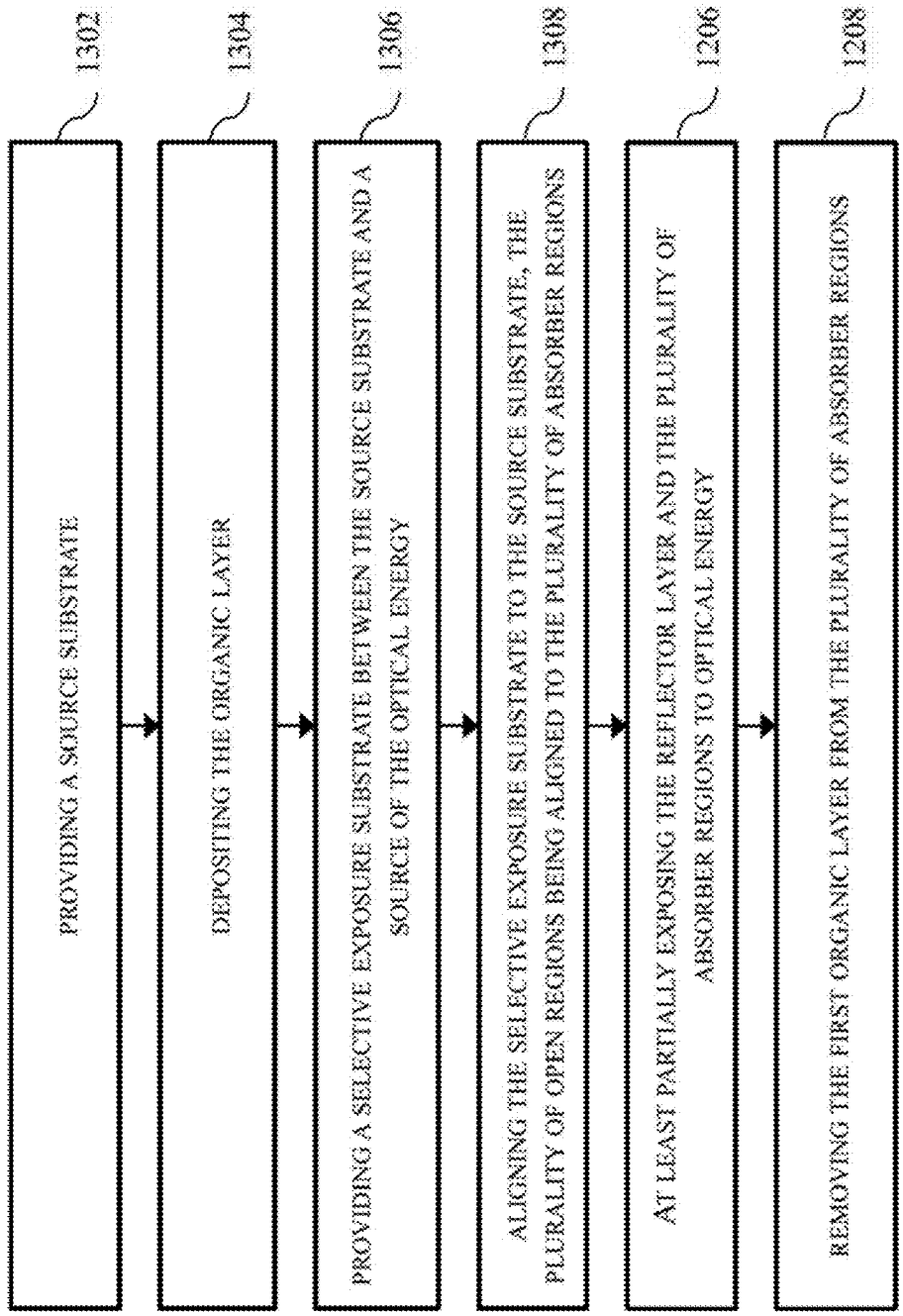
FIG. 11 illustrates an exemplary method of fabricating a patterned source substrate for manufacturing the AMOLED device 300, according to another embodiment of the present invention.

FIG. 11 illustrates an exemplary method 1300 of fabricating a patterned source substrate for manufacturing the AMOLED device 300, according to a second embodiment of the present invention. At step 1302, a source substrate may be provided. The source substrate may be made of a transparent or opaque light absorbing material. The source substrate may define by a first side having a reflector layer. The reflector layer may include one or more absorber regions.

At step 1304, an organic layer is deposited on the source substrate with a first portion of the organic layer (hereinafter referred to as a first organic layer) may be deposited on the absorber regions, and a second portion of the organic layer (hereinafter referred to as second organic layer) may be deposited on the portions of reflector layer not covered by the absorber regions.

At step 1306, in some embodiments, a selective exposure substrate may be provided between the source substrate and a source of optical energy. The selective exposure substrate such as the exposure substrate 1112 may include multiple open regions and closed regions. The open regions may be optically transparent to the visible spectrum. At step 1308, in some embodiments, the selective exposure substrate may be aligned to the source substrate such as the source substrate 906 using a variety of techniques known in the art, related art, or developed later including usage of infrared light for such alignment. The open regions may be aligned to the absorber regions.

At step 1310, the portions of the reflector layer and the absorber regions may be at least partially exposed to light or optical energy. In one example, the absorber region may be exposed to the optical energy through the first organic layer. At step 1312, the first organic layer from the absorber regions is removed to provide a patterned source substrate having an arrangement of the second organic layer and the absorber regions.

The embodiments of disclosed invention provides for precision patterning to produce the Red Green Blue (RGB) pixels for an OLED display. The embodiments of disclosed invention also provides for formation of emitter and functional organic layers on OLED display using the same technique, thus, significantly reducing the complexity and cost of fabrication. The patterning technique in embodiments of the disclosed invention can also be used to manufacture high-resolution large area displays. The embodiments of patterning technique are versatile and applicable for fabrication of all resolutions, shapes and sizes. The embodiments of disclosed invention provide a high throughput and modular patterning technique. The embodiments of the disclosed invention are practiced at a relatively lower temperature (compared to that of laser) in a relatively stable thermal environment. This leads to lower cost of operation and longer life of components used. Further, a simpler process of high-resolution deposition is provided by some embodiments of the present invention. Moreover, the resolution to be achieved should be independent of beam size of an optical source or the heated area of a source base substrate.

It will be understood to a person ordinarily skilled in the art that one embodiment of the invention can be used either with patterned source substrate or an evaporation source in combination with a precision shadow mask.

It is apparent to a person ordinarily skilled in the art that the invention can be applied to all OLED devices which have sublimable organic materials, without changing the scope of the invention, in the same way it is applied to an organic device as described in the specification. It should be understood that this invention is, in many respects, only illustrative. Changes may be made in details, particularly in matters of shape, size, and arrangement of steps without exceeding the scope of the invention. This may include, to the extent that it is appropriate, the use of any of the features of one example embodiment being used in other embodiments. The invention's scope is, of course, defined in the language in which the appended claims are expressed.

While the present disclosure has been described in connection with certain exemplary embodiments, it is understood that the invention is not limited to the disclosed embodiments, but, is intended to cover various modifications and equivalent arrangements included within the spirit and scope of the appended claims, and equivalents thereof.

What is claimed is:

1. A method of manufacturing a plurality of active matrix organic light emitting display devices comprising:
   i) providing a patterned source substrate, providing the patterned source substrate further comprising:
      i. providing a source substrate, the source substrate being defined by a first side, the source substrate having a reflector layer on the first side, the reflector layer having a plurality of absorber regions;
      ii. depositing an organic layer, the organic layer being defined by a first organic layer and a second organic layer, the first organic layer being at the plurality of absorber regions;
      iii. at least partially exposing the reflector layer and the absorber region to optical energy, the reflector layer and the absorber region being exposed through the organic layer; and
      iv. removing the first organic layer from the plurality of absorber regions;
         whereby providing the patterned source substrate having an arrangement of the second organic layer and the plurality of absorber regions; and
   ii) providing a base substrate, the base substrate being substantially non-circular, the base substrate being defined by at least one linear dimension greater than 150 mm, the base substrate being made of crystalline silicon, the crystalline silicon being one of a monocrystalline silicon and a multi-crystalline silicon, the base substrate being doped with an impurity, the impurity being one of a donor impurity and an acceptor impurity, the base substrate having an active matrix organic light emitting display device layout, the patterned source substrate having a mapping to the active matrix organic light emitting display device layout;
   iii) iteratively sublimating the second organic layer from the patterned source substrate to the base substrate to form at least one of one or more functional organic layers on the base substrate;
   iv) encapsulating at least one of one or more functional organic layers and the one or more electrodes except at one or more predefined separation zones on the base substrate; and
   v) separating the plurality of active matrix organic light emitting display devices at the one or more predefined separation zones on the base substrate,
      whereby forming the plurality of active matrix organic light emitting display devices.

2. The method of manufacturing the plurality of active matrix organic light emitting display devices of claim 1, wherein the base substrate has one of a square shape, rectangular shape and a square shape with rounded corners.

3. The method of manufacturing the plurality of active matrix organic light emitting display devices of claim 1, wherein the source substrate and the base substrate are defined by a first plurality of dimensions.

4. The method of manufacturing the plurality of active matrix organic light emitting display devices of claim 1, wherein providing the patterned source substrate further comprising:
   i) providing a selective exposure substrate between the source substrate and a source of the optical energy, the selective exposure substrate being defined by a plurality of open regions and a plurality of closed regions, the plurality of open regions being substantially optically transparent to visible spectrum; and ii) aligning the selective exposure substrate to the source substrate, the plurality of open regions being aligned to the plurality of absorber regions.

5. The method of manufacturing the plurality of active matrix organic light emitting display devices of claim 1, wherein providing the base substrate further comprising one or more of lapping process and polishing process of the base substrate.

6. The method of manufacturing the plurality of active matrix organic light emitting display devices of claim 1 further comprising aligning the base substrate and the patterned source substrate prior to sublimating the second organic layer from the patterned source substrate to the base substrate.

7. The method of manufacturing the plurality of active matrix organic light emitting display devices of claim 1 further comprising:

i) providing a crystalline silicon layer on the base substrate, the crystalline silicon layer being an intrinsic epitaxial silicon layer, the base substrate being one of a square shape, a rectangular shape and a square shape with rounded corners; and ii) fabricating a plurality of pixel circuits and one or more row and column driving circuits, wherein the plurality of pixel circuits and the one or more row and column driving circuits comprising at least one of one or more patterned conductive layers, one or more patterned insulating layers, the crystalline silicon layer and one or more interconnects.

8. The method of manufacturing the plurality of active matrix organic light emitting display devices of claim 1, wherein the impurity has a concentration up to $1 \times 10^{17}$ per cubic centimeter, further wherein the donor impurity is one or more of Group V elements of a periodic table and the acceptor impurity is one or more of Group III elements of the periodic table.

* * * * *